(12) United States Patent
Pool et al.

(10) Patent No.: US 7,420,605 B2
(45) Date of Patent: Sep. 2, 2008

(54) SOLID STATE IMAGER ARRANGEMENTS

(75) Inventors: Peter James Pool, Maldon (GB); Raymond Thomas Bell, Middlesex (GB)

(73) Assignee: E2V Technologies (UK) Limited, Chelmsford (GB)

( * ) Notice: Subject to any disclaimer, the term of this patent is extended or adjusted under 35 U.S.C. 154(b) by 692 days.

(21) Appl. No.: 10/734,597

(22) Filed: Dec. 15, 2003

(65) Prior Publication Data

US 2004/0150737 A1    Aug. 5, 2004

Related U.S. Application Data

(63) Continuation-in-part of application No. 10/622,109, filed on Jul. 18, 2003, now abandoned, which is a continuation of application No. PCT/GB02/00138, filed on Jul. 14, 2002.

(30) Foreign Application Priority Data

Jan. 18, 2001    (GB)    ................... 0101301.0

(51) Int. Cl.
*H04N 3/14*    (2006.01)
*H04N 5/335*    (2006.01)

(52) U.S. Cl. .................. 348/311; 348/314; 348/315; 348/317

(58) Field of Classification Search .................. 348/249, 348/230.1, 313, 314
See application file for complete search history.

(56) References Cited

U.S. PATENT DOCUMENTS

| | | | | |
|---|---|---|---|---|
| 5,337,340 | A * | 8/1994 | Hynecek | 377/60 |
| 5,867,215 | A * | 2/1999 | Kaplan | 348/315 |
| 5,990,953 | A * | 11/1999 | Nakashiba | 348/314 |
| 6,444,968 | B1 * | 9/2002 | Burt et al. | 250/208.1 |
| 2002/0093288 | A1 * | 7/2002 | Spencer et al. | 313/523 |
| 2002/0126213 | A1 * | 9/2002 | Hynecek | 348/241 |
| 2002/0191093 | A1 * | 12/2002 | Hynecek | 348/311 |
| 2003/0035057 | A1 * | 2/2003 | Hakamata et al. | 348/311 |

FOREIGN PATENT DOCUMENTS

| | | | |
|---|---|---|---|
| EP | 0 866 501 A1 | * | 9/1998 |
| EP | 1 152 469 A2 | | 11/2001 |
| EP | 1152469 A2 | * | 11/2001 |
| GB | 2 289 981 | | 12/1995 |
| GB | 2 323 471 | | 9/1998 |
| JP | 03252163 A | * | 11/1991 |
| JP | 2002325720 A | * | 11/2002 |
| WO | 92/21151 A2 | | 11/1992 |

* cited by examiner

*Primary Examiner*—David Ometz
*Assistant Examiner*—Wanda M Negron
(74) *Attorney, Agent, or Firm*—Venable LLP; Robert Kinberg; Jeffri A. Kaminski

(57) ABSTRACT

A solid state imager arrangement includes an image area, an output register which receives signal charge from the image area, a separate multiplication register into which signal charge from the output register is transferred, means for obtaining signal charge multiplication by transferring the charge through a sufficiently high field in elements of the multiplication register, and an additional register into which excess signal charge is transferred.

48 Claims, 8 Drawing Sheets

SOLID STATE IMAGER ARRANGEMENTS

CROSS REFERENCE TO RELATED APPLICATIONS

This application is a continuation-in-part of application Ser. No. 10/622,109, filed Jul. 18, 2003, which is a continuation of International Application No. PCT/GB02/00138, filed Jul. 14, 2002, and claiming priority to British Application GB 0101301.0 filed Jan. 18, 2001, to which the present application also claims priority. The disclosures of the foregoing applications, together with the disclosures of each and every U.S. and foreign patent and patent application mentioned below are incorporated herein by reference in their entirety.

BACKGROUND OF THE INVENTION

This invention relates to solid-state imager arrangements and more particularly to arrangements in which signal charge multiplication is implemented.

In a typical charge coupled device (CCD) imager, signal charge representative of incident radiation is accumulated in an array of pixels over an image area. Following an integration period, signal charge is transferred to an output register by applying appropriate clocking or drive pulses to control electrodes. The signal charge is then read out from the output register and applied to a charge detection circuit to produce a voltage, which is representative of the amount of signal charge.

Our previously published patent application, GB-A-2323471 discloses a CCD imager arrangement in which signal charge multiplication is obtained by providing a separate multiplication register following the output register. Charge is transferred through high field regions in elements of the multiplication register, thus accelerating the signal charge carriers and generating additional carriers through impact ionisation. As carrier multiplication occurs outside the conventional CCD structure itself, both the operation of the multiplication register and the CCD imager may be optimised without compromising the performance of one for the sake of the other.

The present invention seeks to provide an improved solid-state imager arrangement.

SUMMARY OF THE INVENTION

According to the present invention, there is provided a solid state imager arrangement comprising: an image area, an output register which receives signal charge from the image area, a separate multiplication register into which signal charge from the output register is transferred, means for obtaining signal charge multiplication by transferring the charge through a sufficiently high field in elements of the multiplication register, and an additional register into which excess signal charge is transferred.

The invention is particularly suitable for arrangements in which the solid-state imager is a CCD imager but it may be applicable to other types of solid-state device in which packets of signal charge are transferred into an output register.

The excess signal charge is that charge originating from the image area, which does not pass entirely through the charge multiplication register. In the previously proposed arrangement, in parts of a scene of high illumination there is a risk that the well capacities in the multiplication register can be exceeded, leading to saturation and loss of image resolution. Thus, a drain region may be included which accepts charge exceeding a threshold value to avoid saturation.

The present invention has realised that although the previously proposed structure offers good performance, it is possible to enhance it still further. The inclusion of an additional register to accept excess charge means that in circumstances where the well capacities of the multiplication register are likely to be exceeded, some of the signal charge originating from the image area is diverted away from the multiplication part of the arrangement. Instead, this excess signal charge is transferred to the additional register, which is a structure also capable of holding charge packets, which may be controllably moved through the additional register. The remaining charge, which passes through each multiplication stage, may then be recombined with the excess charge from the additional register. For example, the signal charge packet may be reconstituted by appropriate synchronised clocking of the two register outputs to transfer corresponding charge packets from the multiplication and additional registers to a single charge detection circuit simultaneously. The combining step is conveniently carried out before any further processing of the signal charge is carried out but it could be implemented at a later stage in the processing sequence, for example after charge has been converted at separate charge detection circuits or following conversion into video output. It may not always be necessary to synchronise the multiplication and additional register readouts providing provision is made for combining the signal from charge packets originating from the same pixel.

By using the invention, the dynamic range may be increased in comparison with the previous arrangement. In the previous arrangement, charge is lost to preserve image resolution at high illumination levels. With the present invention, the additional register acts as an overflow to store the excess signal charge, which can then be usefully added back to the multiplied charge instead of being discarded. This gives the capability for the same imager arrangement to be used for both low light conditions and daylight conditions. It also permits dark and bright images in a scene to be detected simultaneously without loss of resolution in the high intensity regions.

The dynamic range capability of a CCD is often described by the ratio of the saturation signal to the read noise. In the previous device employing a multiplication register, the transfer curve is linear and saturation is determined by the charge handling capability of the output circuit or of the elements of the multiplication register which is typically only a few times greater than that of the pixel. Since gain implemented by the multiplication register may be 200 times or greater, the saturation signal may represent less than 1% of the well capacity of the pixel. By employing the invention, however, the whole range of pixel well capacity may be used, giving the consequent increase in dynamic range.

The transfer of excess signal charge into the additional register may be accomplished by passive means or by active means, such as a gate electrode structure to which control signals are applied.

There are several ways in which excess charge may be separated from the remaining charge, which is transferred through each element of the multiplication register. In one embodiment, the signal charge from the output register is applied to the multiplication register. The charge is increased as it is clocked through the multiplication register and undergoes signal multiplication. The additional register is located adjacent the multiplication register, separated therefrom by a potential barrier. Excess charge from the multiplication register flows over the barrier and into a corresponding element of the additional register. The signal charge from the two registers may be detected on separate amplifiers or combined and detected on a single output as the sum of the two register outputs.

If the multiplication register has a peak capacity N electrons and a gain of G, the response is linear with a slope of G up to N/G input electrons and then logarithmic to N input electrons. For signal inputs of N electrons or greater, all elements of the multiplication register will be full, so gain contribution to the output signal will be fixed and the response will consequently, again, be linear with a slope of 1. Thus, the dynamic range is effectively extended by a factor of approximately G, but the additional capacity required is only increased by the logarithm of G.

The excess signal charge may be transferred to the additional register via one or more elements of the multiplication register as described above. In another embodiment, excess charge is separated from the remainder of the signal charge before the remainder is applied to the multiplication register. For example, signal charge may be detected or sampled either before application of the charge packet to the multiplication register or via one or more elements of the multiplication register. Subsequent transfer of the excess signal charge to the additional register may then be carried out depending on the magnitude of signal charge detected. For example, if it is determined that the signal charge in the first element of multiplication register would lead to saturation in the final element of the multiplication register, following amplification as the charge is transferred through the multiplication register, an amount of signal charge suitable to prevent saturation from occurring may be diverted as excess charge to the additional register. In another embodiment, a fixed percentage of the signal charge may always be diverted to the additional register as excess charge, but this may lead to some reduction in the amount of multiplication, which could otherwise be achieved.

The excess signal charge may simply be that which exceeds a threshold level at some stage in the transfer of the signal charge through the multiplication register. The threshold level may be fixed or may be variable to take into account changes in the scene being viewed by the arrangement and/or ambient conditions.

The arrangement may be such that each element of the multiplication register corresponds to and is in communication with an element in the additional register, with transfer of excess charge being possible from each element in the multiplication register. In another arrangement, such transfer may only be possible from certain of the elements of the multiplication register, for example from alternate elements or from elements towards the output end of the multiplication register.

In a preferred embodiment, the additional register is located physically close to the multiplication register so as to permit direct transfer of charge between the two via the intervening structure. However, they could be remotely located with respect to one another with charge being transferred via intervening circuitry and clocking techniques.

The invention is most applicable to an arrangement in which a single multiplication and a single additional register are included. However, in some embodiments, a multiplication register may be associated with a plurality of additional registers, which may be arranged in parallel or in a cascade arrangement. Also, a plurality of multiplication registers, each with its own additional register or registers may be included in an arrangement to accept signal charge from a single output register. These architectures however are somewhat complicated and it is not apparent that the complexity would be offset by improved performance.

BRIEF DESCRIPTION OF THE FIGURES

Some ways in which the invention may be performed are now described by way of example with reference to the accompanying drawings, in which.

DETAILED DESCRIPTION OF THE INVENTION

Figure 1:
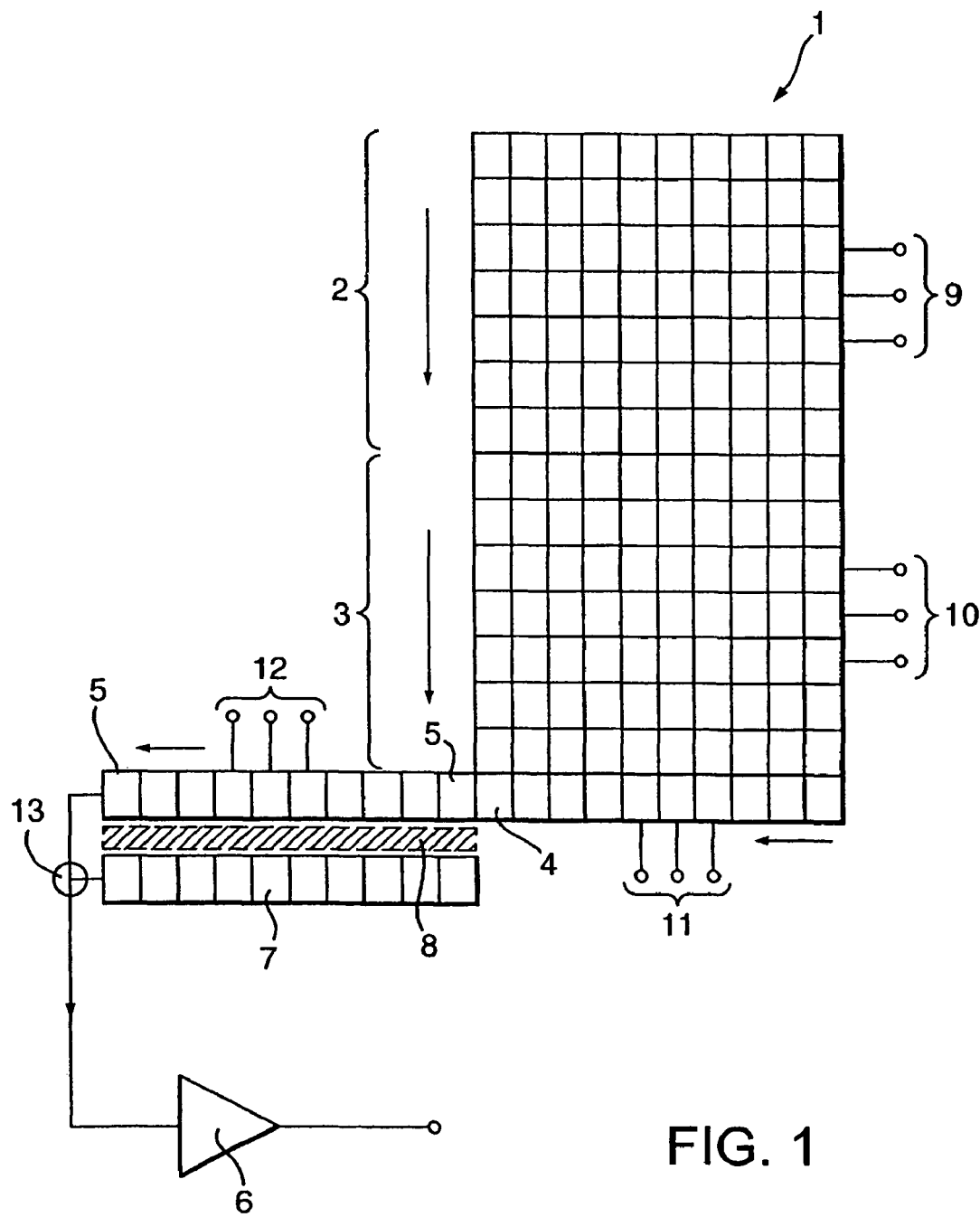
FIG. 1: schematically shows a CCD imager arrangement in accordance with the invention.

The embodiments of the invention all involve the use of a multiplication register for multiplying signal charge from a solid-state imager and an additional register arranged to receive excess charge. The purpose of the arrangement is to provide a greater dynamic range by providing gain to small levels of charge (low light levels) whilst avoiding providing too much gain to higher levels of charge (high light levels).

Charge is divided between the multiplication register and the additional register in two ways. First, as described later in relation to FIG. 1, excess charge transfers from each element of the multiplication register to corresponding elements of the additional register. This transfer can be by overspill over a potential barrier (FIG. 7) or by clocked elements (FIG. 8). Second, as described later in relation to FIGS. 2 and 3, excess charge is transferred to the additional register prior to applying charge to the multiplication register. The first and second methods of dividing the charge may be used together or separately. The preferred embodiment uses both charge division before the multiplication register and transfer from the multiplication register to the additional register, although these will be described separately for clarity.

The embodiments start from the premise that, for the portion of the signal from the imager that has, say, greater than 20,000 electrons, no benefit accrues from multiplication. This size of signal can be detected efficiently with a conventional charge detection circuit. By diversion of excess charge from the gain register into a parallel, non-gain, register, only a small proportion of the charge (that which cannot be efficiently detected without gain) is subject to gain. The total charge in the gain and the non-gain registers will not be much greater than for a system with no gain, and so the two charge streams may be recombined, since the total is within the range of a single charge detection circuit with a sensitivity only slightly less than would be required with no gain register. As described later, therefore, the streams of charge in the gain (multiplication) and non-gain (additional) registers can be recombined prior to detection.

The option still exists to detect the two charge streams on different charge detection circuits, but little or nothing is gained in performance at the expense of greater complexity.

Charge partition between the multiplication and additional registers takes place before the charge multiplication. In addition, as gain is applied and the amount of charge in the gain register increases, the excess is continually diverted to the parallel, non-gain register along the whole length of the gain register. In this way, the gain register only ever needs to handle a small amount of charge so, rather than increasing in width, the width is small and remains small.

The gain register includes a high voltage clock, which is responsible for significant power dissipation when applied to the capacitance of the gain register. Keeping this register small gives useful reduction in power dissipation.

In order to maintain a very low charge level in the gain register the storage area is small and the potential barrier separating the gain register and overspill register is also low. With a non-clocked barrier presenting this low potential barrier (FIG. 7), it is only possible to hold a large amount of charge in the overspill register by giving that register a large storage area. This large storage area increases capacitance and hence increases the power dissipated during clocking. The clocked overspill (FIG. 8) effectively makes the barrier directional, so charge cannot flow from the overspill to multiplication register and the storage area can, therefore, be more moderate.

With reference to FIG. 1, a CCD imager 1 includes an image area 2, a store section 3 and an output or readout register 4. the output register 4 is extended linearly to provide a multiplication register 5, the output of which is connected to a charge detection circuit 6. An additional register 7 having the same number of elements as the multiplication register 5 is located physically adjacent to the multiplication register 5, an implanted barrier region 8, shown schematically, being located between the two registers 5 and 7.

During operation of the device, incident radiation is converted at the image area 2 into signal charge representative of the intensity of radiation, which impinges on the pixel array making up the image area 2. Following an integration period during which image acquisition occurs, drive pulses are applied to control electrodes 9 to transfer charge accumulated at the pixels of the image area 2 to the store section 3. Simultaneously, drive signals are also applied to control electrodes 10 at the store section to cause charge to be transferred row by row towards the output register 4.

When a row of signal charge has been transferred to the output register 4, appropriate drive pulses are applied to electrodes 11 to sequentially transfer the signal charge from the elements of the output register 4 to those of the multiplication register 5, which is of similar architecture to the output register.

Multiplication of charge is implemented at each element of the multiplication register 5. High amplitude drive pulses, at the rate at which charge is clocked through the output register 4, are applied to control electrodes 12 to both transfer signal charge from one element to the next adjacent element in the direction shown by the arrow and also to increase the level of signal charge by an amount determined by the amplitude of the drive pulses. As each packet of charge is transferred through the multiplication register from one element to the next, the signal charge increases. The output of the multiplication register 5 is applied to the charge detector 6, this being a multiplied version of the signal charge collected in the output register 4. At each stage of the multiplication register 5, the signal charge is increased and each signal charge packet stored in the output register 4 undergoes identical multiplication process as each travels through all the elements of the multiplication register 5. In another embodiment, signal charge multiplication is controlled by the level of one or more dc potentials applied to the register.

The above description of the operation of the arrangement shown in FIG. 1 is carried out when the signal charge collected at the image area 2 is relatively small and thus saturation does not occur during transfer through the multiplication register 5, the well capacity of the final element or elements of the register 5 being sufficient to accommodate the multiplied charge packets. However, in the event that the charge collected increases beyond the well capacity of the elements of the register 5, some of the charge is transferred from the elements of the multiplication register 5 via the implanted barrier into corresponding elements of the additional register 7. The amount of excess charge transferred to the additional register 7 is dependent on the barrier potential. In this embodiment, the barrier potential is fixed and is uniform along the length of the multiplication and additional registers 5 and 7. In other devices the potential is variable via control electrodes and/or is non-uniform. If the charge applied to the first element of the multiplication register 5 is reasonably small, so that at the final element 5 the well capacity would only be exceeded by a relatively small amount, transfer via the barrier between the two registers only occurs between elements at the ends of the registers where the charge has undergone the most multiplication, for example, over the last two or three elements. Where a larger signal charge appears at the first element of the multiplication register 5, then transfer of the excess charge to the additional register 7 occurs over a greater length of the two registers, transfer being possible between each element of the multiplication register 5 and a corresponding element of the additional register 7. The two registers 5 and 7 are clocked in synchronism so that the charge appearing at the final element of the two registers originated with the same packet of signal charge from a common pixel of the image area 2. The outputs of the two registers are then combined at combiner 13 prior to being applied to the charge detector 6. In one embodiment, the registers are clocked in synchronism with line timing of a television signal.

The elements of the multiplication and/or additional registers may have the same charge capacity, or elements nearer the end or ends may have larger charge capacity.

In another embodiment (described later in relation to FIG. 8), a control gate structure is disposed between the multiplication register 5 and additional register 7 to control the transfer of excess charge to the latter by applying suitable control pulses. A combination of the two approaches may be used.

Figure 2:
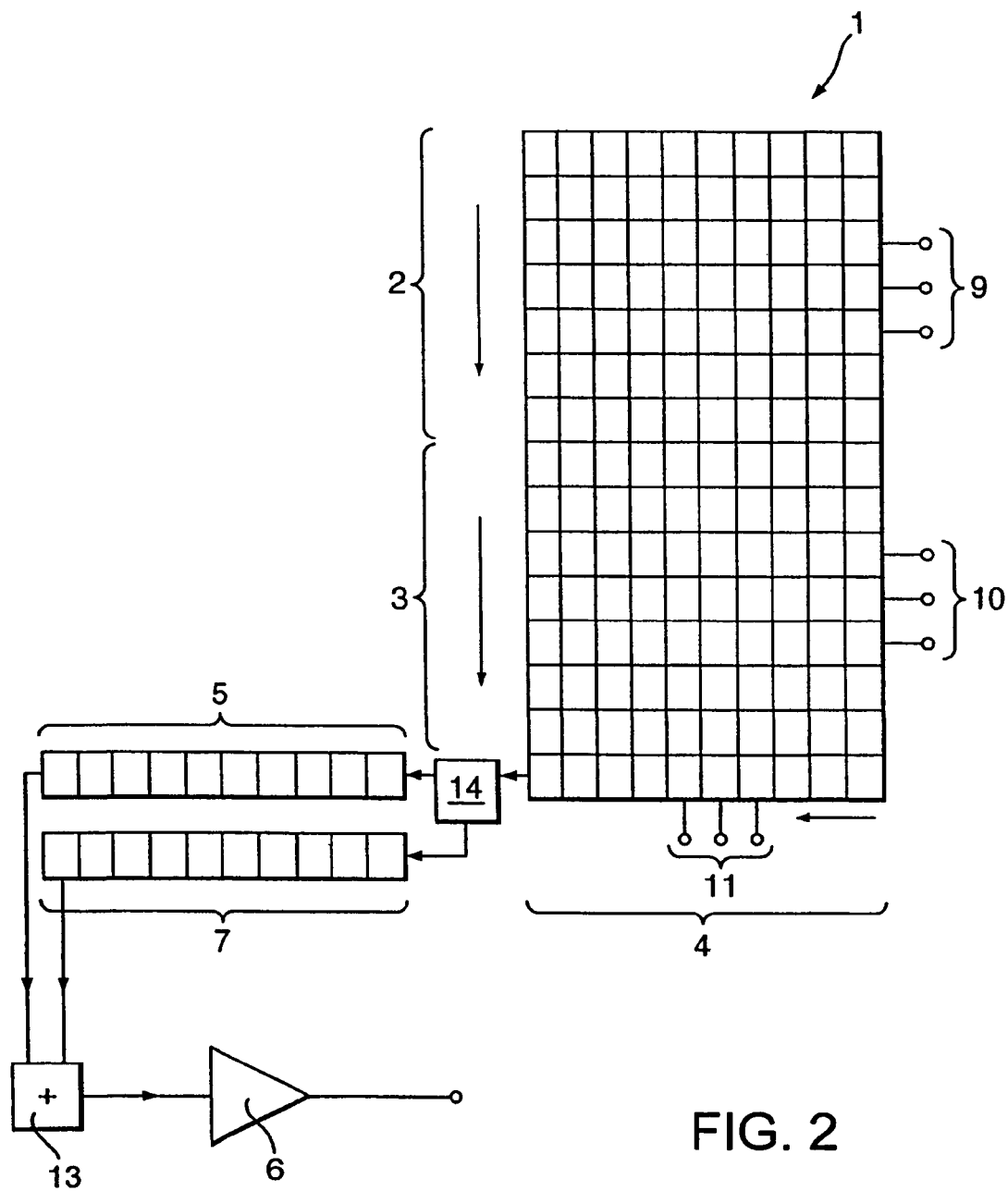
FIGS. 2 to 4: shows other arrangements in accordance with the invention.

FIG. 2 illustrates another embodiment of the invention in which a processing circuit is located between the output register 4 and the multiplication register 5. A detector circuit 14 detects the amount of charge for an element from the output register 4 and causes a fixed percentage of that charge to be diverted to the additional register 7. In other respects, the arrangement is similar to that shown in FIG. 1. However, in this type of device, it is not necessary to arrange for the additional register 7 to be in physical proximity to the multiplication register 5 as there is no direct connection between the two for transfer of excess charge to the additional register 7.

In the devices of FIGS. 1 and 2, the charge from the multiplication register and that from the additional register is recombined prior to being applied to charge detector 6. In other arrangements, recombination is carried out at a later stage in the processing of the output signal. Also, it may be desirable in some applications to add a multiplication capability to the additional register 7, which performs in a similar way to that of the multiplication register 5.

Figure 3:
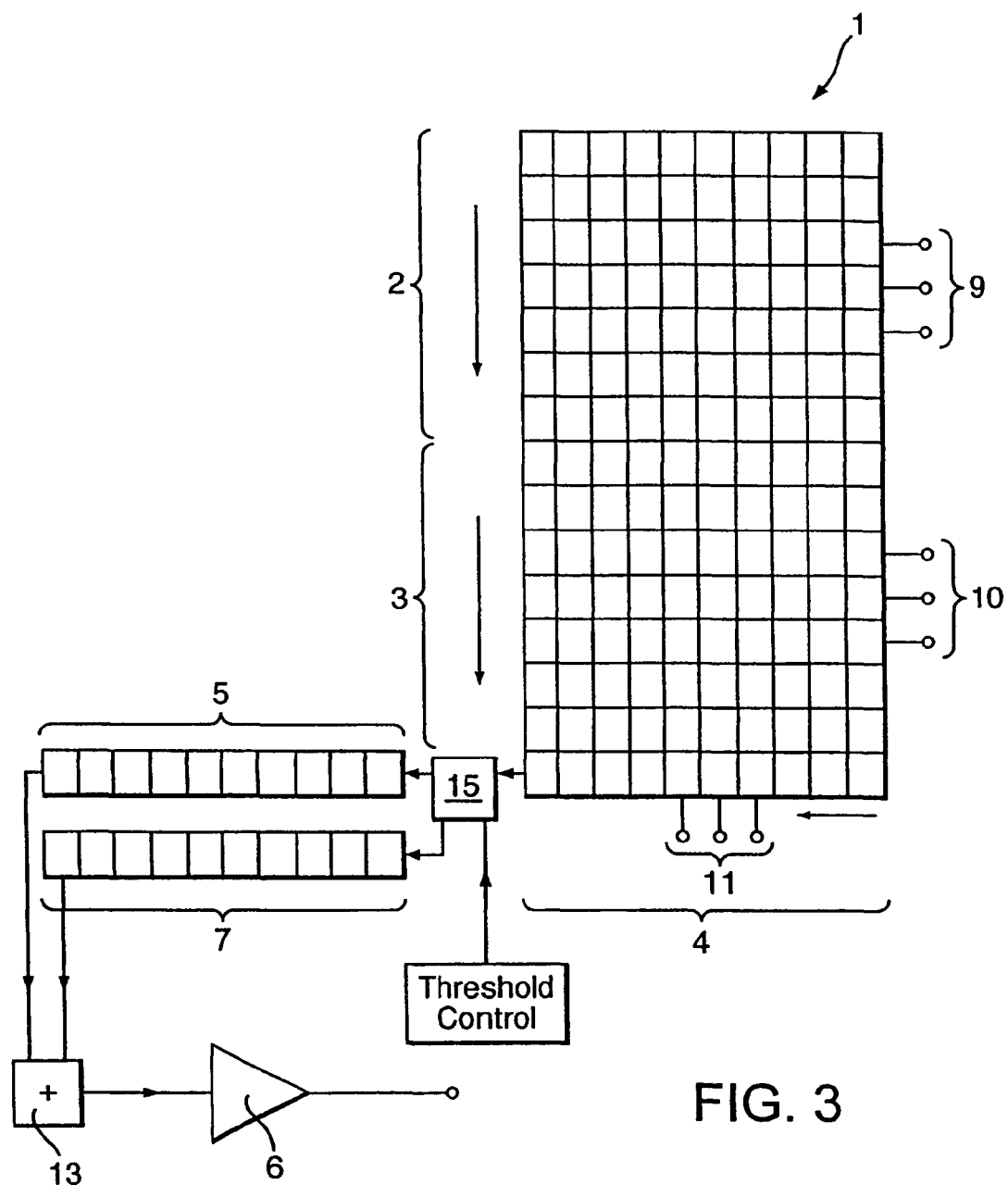

With reference to FIG. 3, in another embodiment similar to that shown in FIG. 2, a threshold circuit 15 replaces the detector circuit 14 and acts on applied signal charge to divert charge exceeding a threshold level to the additional register 7. The threshold level can be fixed or variable. For example, it may be arranged to automatically track changes in ambient temperature or other parameters, or it could be controllably adjustable.

Figure 4:
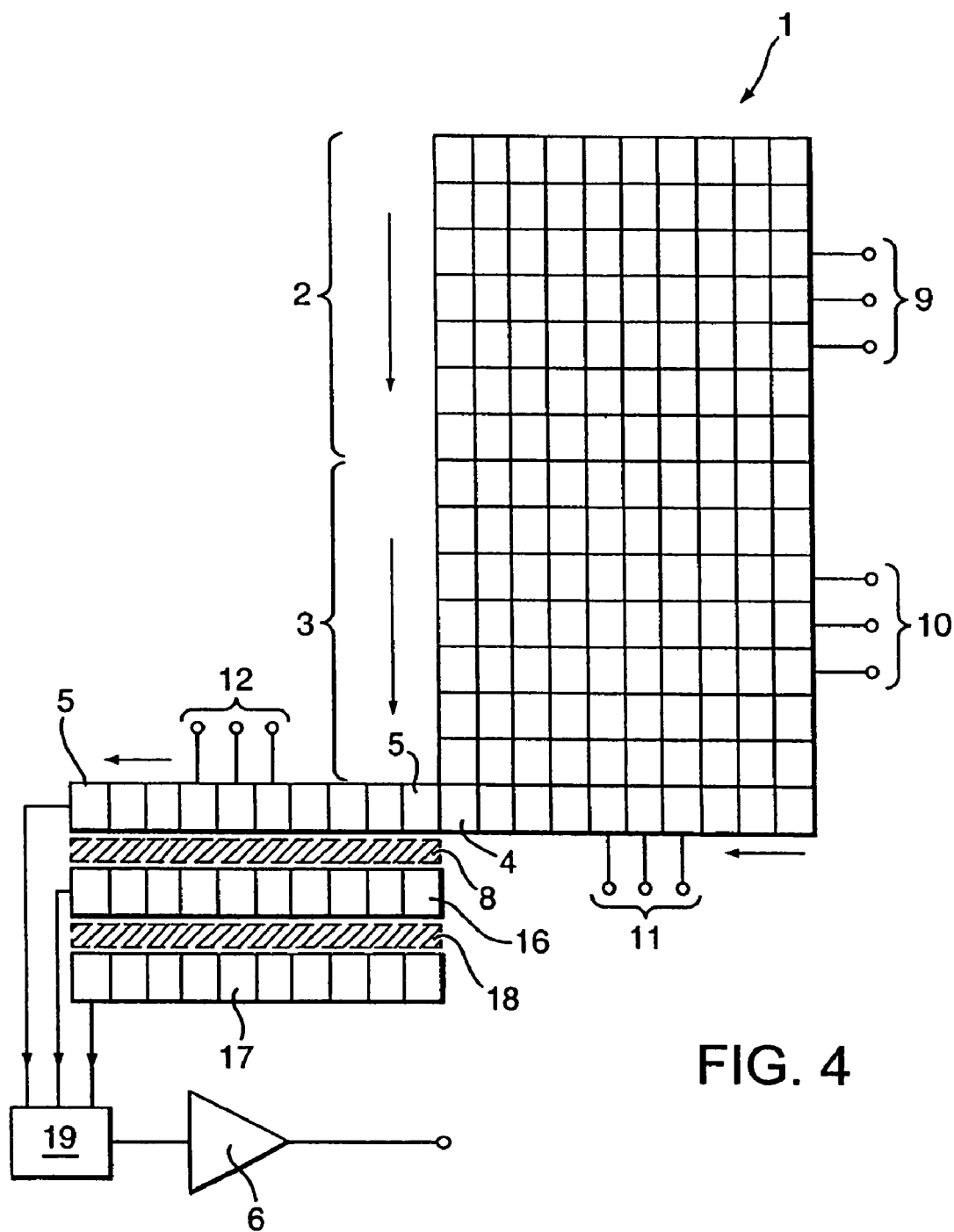

With reference to FIG. 4, a device similar to that of FIG. 1 also includes an implanted barrier 8 between a multiplication register 5 and additional register means for carrying excess charge. However the register means includes two additional registers 16 and 17 also having an implanted barrier 18 between them. Excess charge from additional register 16 is thus transferred to additional register 17, and outputs of the three registers are recombined at combiner 19. This arrangement may be advantageous where signal charge multiplication is carried out in the first additional register 16 as well as in the multiplication register 5. In other architectures (not shown), several additional registers may be arranged in communication with a respective different set of the elements of the multiplication register.

FIGS. 1-4 illustrate the application of the invention to a CCD imager of the Frame Transfer architecture but it is equally applicable to all other architectures e.g. Interline Transfer and Linear imagers.

Figure 5:
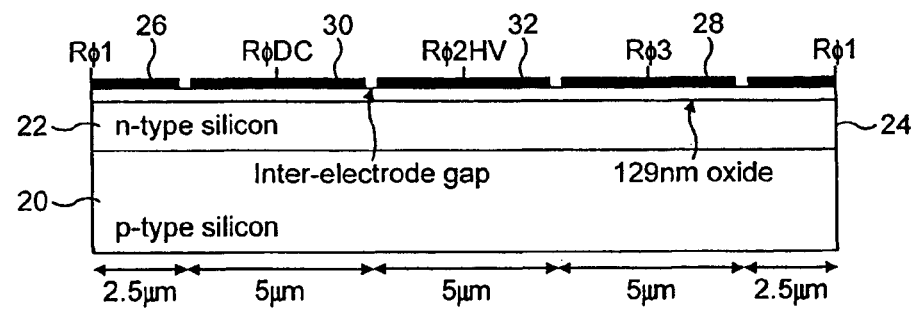
FIG. 5: shows an element of the multiplication register of FIGS. 1 to 4.
Figure 6:
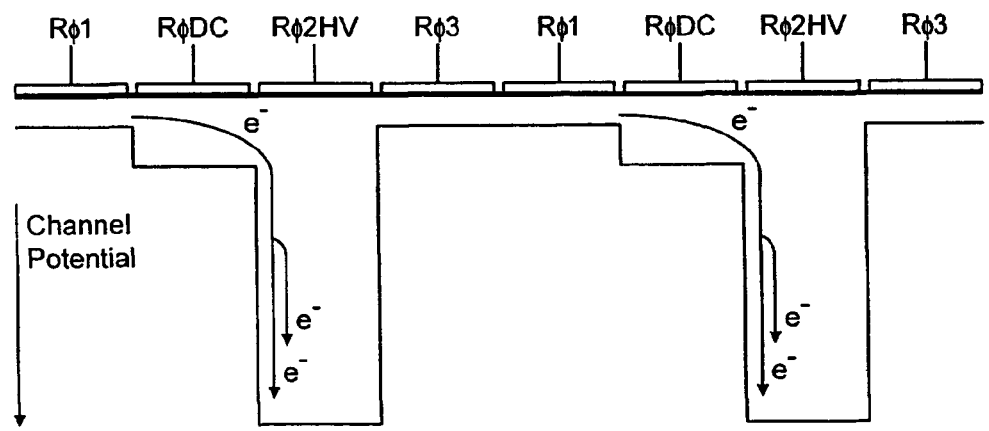
FIG. 6: shows the well potential of the elements of FIG. 5.

A schematic cross section of each element in the multiplication register is shown in FIG. 5. The element comprises a base 20 of p-type silicon, an n-type layer 22 and a dielectric layer 24. (this describes an n-channel CCD. In principle, the multiplication structures described could also be applied to a p-channel CCD) On the dielectric layer, each element has four electrodes shown as normal clocked electrodes R$\phi$1 26 and R$\phi$3 28, a DC electrode R$\phi$DC 30 and a high voltage electrode R$\phi$2HV 32. The element provides gain by clocking voltages at the electrodes such that a relatively high voltage at electrode R$\phi$2HV 32 causes multiplication of charge. The clocking of the electrodes is shown further in FIG. 6.

The element of the multiplication register is made up of four phases although other configurations could be possible. R$\phi$1 and R$\phi$3 are clocked as normal readout register phases. R$\phi$DC is a DC phase that separates R$\phi$1 from R$\phi$2HV. R$\phi$2HV, the multiplication phase, is a clocked phase but using a much greater amplitude than R$\phi$1 and R$\phi$3. On the high to low transition of R$\phi$1, signal originally under R$\phi$1 will drift to R$\phi$2HV. The potential on R$\phi$2HV is set high enough so that the fields experienced by the electron signal will cause multiplication to take place. Once the signal electrons and the electrons created by the impact ionisation are collected under R$\phi$2HV the total amplified signal can then be transferred to R$\phi$3 by switching R$\phi$2HV low and R$\phi$3 high. The process is repeated through all the gain elements in the multiplication register. As an example, the device could have 591 gain elements. If the impact ionisation increases the signal by 1% at each element, the combined gain of the register of the CCD65 will be $1.01^{591}=358$.

As shown, charge is increased in each element by application of voltage at R$\phi$2HV, which causes impact electrons to form. It is noted, for the avoidance of doubt that the voltages shown are clocked and so vary in amplitude. The voltages are shown at a given instant.

Figure 7:
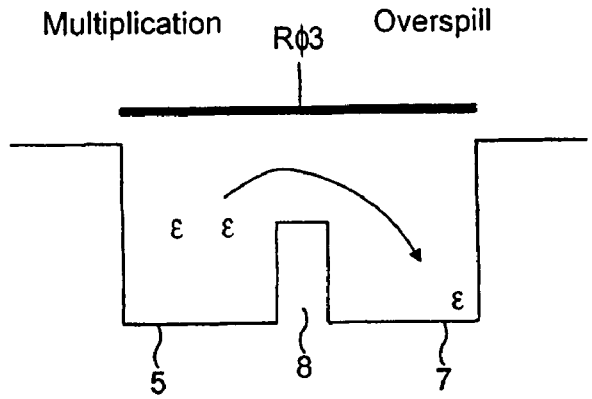
FIG. 7: shows the well potential of the barrier element of FIG. 1.
Figure 8:
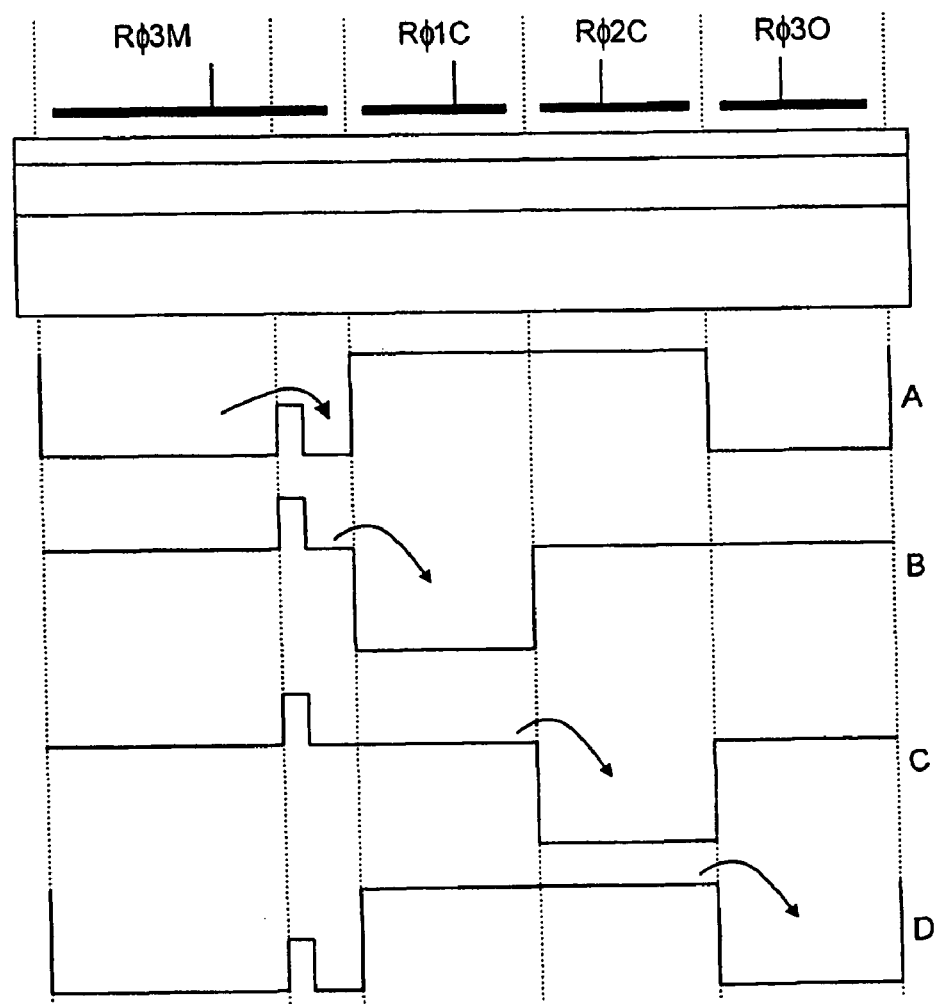
FIG. 8: shows a clocking element as may be used with the arrangement of FIGS. 1 to 4 and the well potential at three time intervals.

The elements of the multiplication register in the arrangement of FIGS. 1 to 4 described are arranged adjacent corresponding elements of the additional register with a barrier region 8 between them as previously described, and this barrier is shown in more detail in FIG. 7.

One element of the multiplication register 5, barrier region 8 and additional register 7 are shown. As can be seen, the electrons that have been subject to multiplication collect in R$\phi$3 well of the multiplication elements 5. A barrier potential 8 between the multiplication elements and the overspill additional register 7 ensures that electrons do not transfer until the charge in each multiplication element reaches the barrier level, at which point excess charge spills over into wells of the additional register 7 as shown by the arrow.

As previously noted, the preferred embodiment of the invention is a CCD imager as shown and described in relation to FIGS. 1 to 4, but modified to include a clocking region in addition to the barrier region 8. The clocking region comprises a group of elements, one such group being shown in FIG. 8. Each clocking element is arranged between one element of the multiplication register and one element of the additional register. The final electrode of each multiplication element is R$\phi$3M and this is separated into two regions by a potential barrier. Charge is transferred into the main region from the previous electrode of the multiplication register. On progressing through successive elements of the multiplication register, charge is increased until the charge in one of the wells under electrode R$\phi$3M is sufficient to spill over into the smaller region. The clocking element then proceeds through a three-phase cycle.

In the first phase, as shown diagrammatically in FIG. 8 (A), potentials at R$\phi$1C and R$\phi$2C are low (that is the voltage applied is low so the well is shallow) so that electrons passing the barrier are trapped. At the second phase, FIG. 8(B), the potential at R$\phi$1C goes high and at R$\phi$3M goes low causing electrons to transfer to the well under R$\phi$1C. In the third phase FIG. 8(C) the potential at electrode R$\phi$1C goes low and at R$\phi$2C goes high transferring charge to the well at R$\phi$2C. Lastly in FIG. 8(D) the potential at electrode R$\phi$2C goes low and at R$\phi$3O goes high transferring charge to the well at R$\phi$3O in the overspill register.

The embodiment thus does not gather charge on the opposite side of the barrier potential from R$\phi$3M, but moves charge away to R$\phi$1C and R$\phi$2C from where it is transferred to the additional register. By doing so, the extension of dynamic range is not impaired by the limited capacity of the overspill register with a low potential barrier as in the arrangement of FIG. 7.

The clocking connections for multiplication and additional registers and the clocking elements between them will now be described.

The various regions of the multiplication and overspill register structure may in principle have separate clock connections. For the Multiplication register these may be designated R$\phi$1M, R$\phi$DC, R$\phi$2HV, and R$\phi$3M (using the suffix M to denote "m" ultiplication and to distinguish from other registers). For the Overspill register they may be designated R$\phi$1O, R$\phi$2O and R$\phi$3O (using the suffix 0 to denote "o"verspill). For the additional clocking region between the two registers they may be designated R$\phi$1C, R$\phi$2C and R$\phi$3C (using the suffix C to denote "c" lock). R$\phi$3C is not shown in FIGS. 8-10 but it may exist in a practical application of the invention. Separate clock pulses may be applied to all of these connections and variety of clocking schemes devised which would give correct operation of the structures. However there are clear advantages to be obtained both in layout topology and operational simplicity if a number of these clock connections are commoned together.

Figure 9:
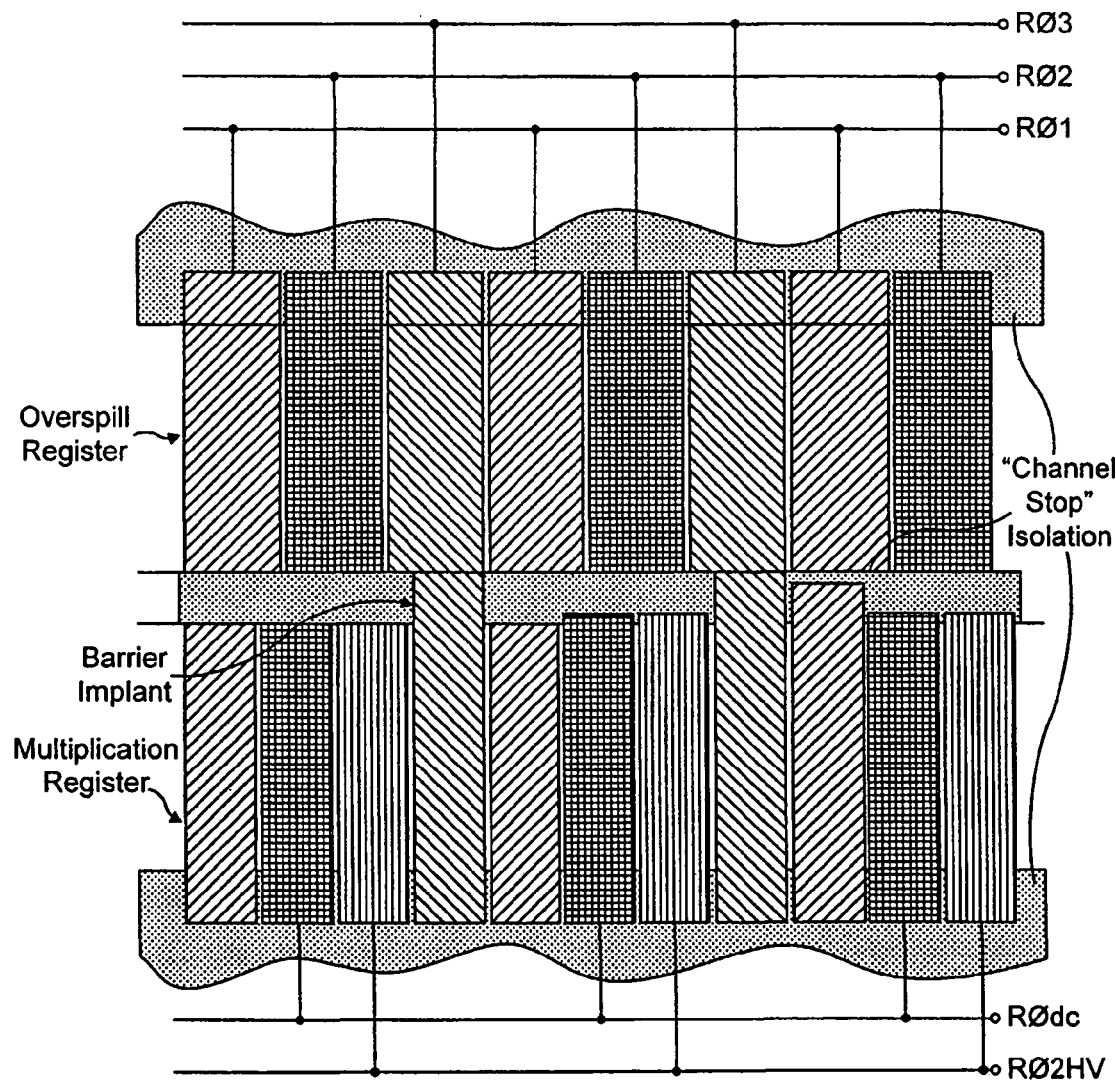
FIG. 9: shows the physical register and barrier implant structure of FIGS. 1 to 4.
Figure 10:
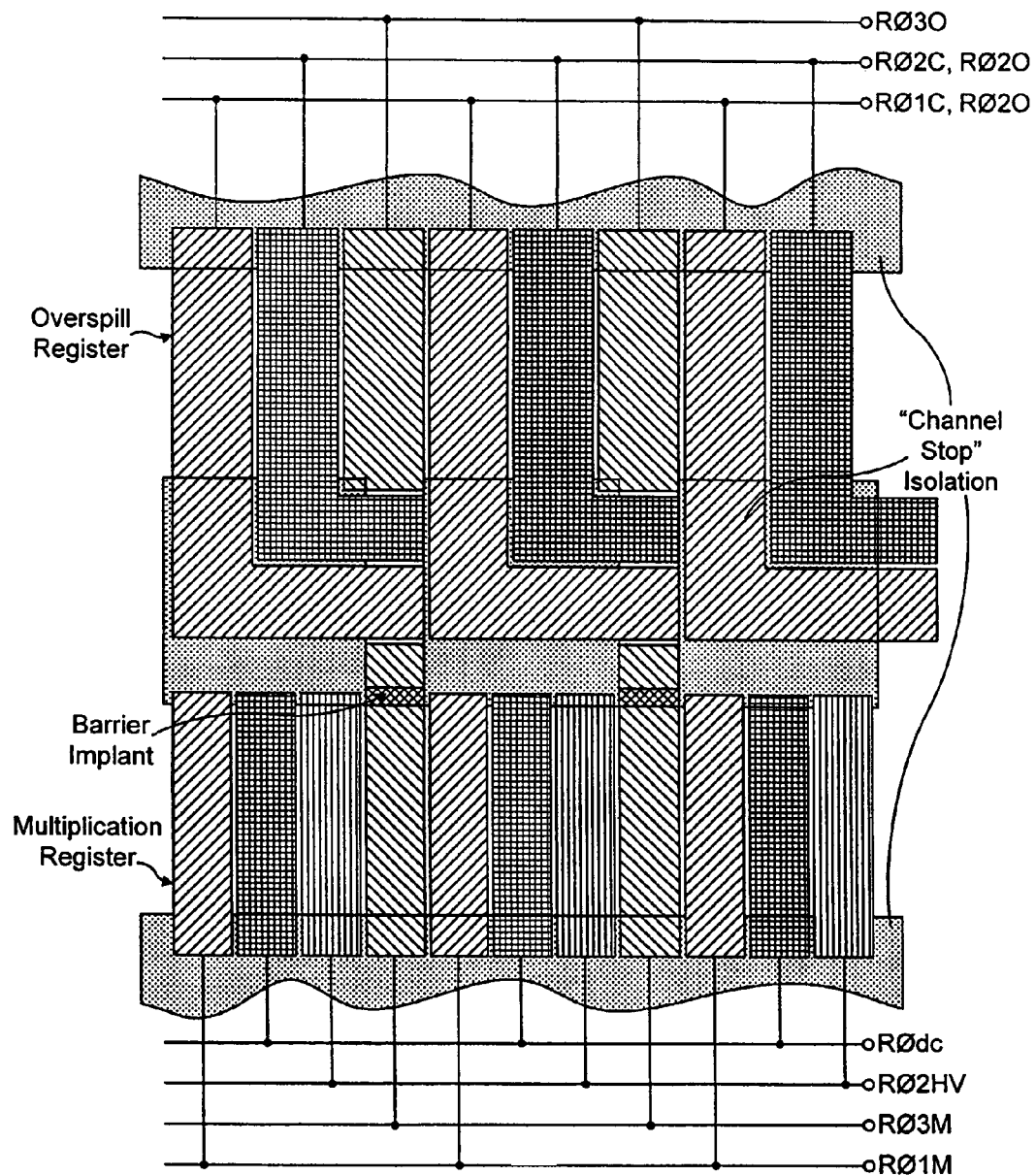
FIG. 10: shows the physical register and clocked element structure of the clocking element of FIG. 8.

In the case of the unclocked transfer of charge from the multiplication to the overspill register, as shown in FIG. 9, R$\phi$1M and R$\phi$1O may be joined to form a single R$\phi$1; R$\phi$3M and R$\phi$3O may be joined to form a single R$\phi$3. The same clock pulse sequence and timing as would be required for a simple multiplication register without overspill may then be used to operate the device with the addition of a single extra clock phase R$\phi$2O (typically designated R$\phi$2) which completes a normal 3-phase group of clocks with R$\phi$1 and R$\phi$3. These 3 clock phases R$\phi$1, R$\phi$2 and R$\phi$3 may also be joined to the corresponding clock connections for the standard readout register of the CCD (designated 11 in FIG. 1).

In the case of a clocked overspill structure a similar set of connections may be made. R$\phi$1M, R$\phi$1O and R$\phi$1C may be joined to form a single R$\phi$1; R$\phi$2O and R$\phi$2C joined to form R$\phi$2 and R$\phi$3M, R$\phi$3O and R$\phi$3C joined to form R$\phi$3. These clocks may also be commoned with those of the standard readout register as before. The resulting structure has the same set of connections as the basic structure and will operate with the same set of clock pulses (timing and amplitude). It must be noted however that the charge, which is clocked to the overspill register, is effectively delayed by one element from its associated signal in the multiplication register and allowance must be made for this in recombining the signal e.g. by including an extra element between the multiplication register and the output amplifier. The clock connections may be commoned in a number of different ways depending on the layout topology of the CCD e.g. the way in which the multiplication register is folded to minimise device area. As indicated in the figures a single polysilicon electrode may cross 2 or 3 regions to common the clock connection directly. Alternatively (also as indicated) polysilicon electrodes for different regions may connect to separate low-resistance bus lines (as is standard for CCDs) and these bus lines may join on chip or be connected to separate bond pads with the connection made externally. In practical implementations of CCD image sensors we have made these common connections which means that only two additional connections (R$\phi$DC and R$\phi$2HV) to those required for a standard CCD allow operation of any device with a multiplication register and either (or no) overspill register structure.

The invention has been described in detail with respect to referred embodiments, and it will now be apparent from the foregoing to those skilled in the art, that changes and modifications may be made without departing from the invention in its broader aspects, and the invention, therefore, as defined in the appended claims, is intended to cover all such changes and modifications that fall within the true spirit of the invention.

What is claimed is:

1. A solid state imager arrangement comprising: an image area, an output register which receives signal charge from the image area, a separate multiplication register into which signal charge from the output register is transferred, means for obtaining signal charge multiplication by transferring the charge through a sufficiently high field in elements of the multiplication register, and an additional register into which excess signal charge is transferred, wherein excess signal charge is transferred to the additional register via one or more elements of the multiplication register.

2. An arrangement as claimed in claim 1, wherein the excess signal charge is that exceeding a threshold level.

3. An arrangement as claimed in claim 2, wherein the threshold level is variable.

4. An arrangement as claimed in claim 1, wherein the excess signal charge is a percentage of the signal charge received from the image area.

5. An arrangement as claimed in claim 1, wherein excess signal charge is transferable from each element of the multiplication register to the additional register.

6. An arrangement as claimed in claim 1, wherein the multiplication register and additional register have the same number of elements.

7. An arrangement as claimed in claim 1 and wherein the amount of excess charge transferred to the additional register is determined by implanted barrier means.

8. An arrangement as claimed in claim 7, wherein the barrier means is located between the multiplication register and the additional register.

9. An arrangement as claimed in claim 1 and including gate means for controlling the transfer of excess signal charge to the additional register.

10. An arrangement as claimed in claim 1 and including means for combining signal charge after it has been transferred through the multiplication register with excess charge from the additional register.

11. An arrangement as claimed in claim 1, wherein signal charge multiplication is obtained in the additional register.

12. An arrangement as claimed in claim 1 and including a plurality of additional registers associated with the multiplication register.

13. An arrangement as claimed in claim 1, wherein a sufficiently high field region is obtained in each element of the multiplication register.

14. An arrangement as claimed in claim 1 and including means for synchronizing signal readout from the multiplication register with line timing of a television rate signal.

15. An arrangement as claimed in claim 1, wherein signal charge is clocked through the multiplication register and excess charge through the additional register at the same rate as charge is clocked through the output register.

16. An arrangement as claimed in claim 1, wherein the amount of signal charge multiplication is controlled by controlling the amplitude of one or more drive pulses applied to a register to transfer signal charge therethrough.

17. An arrangement as claimed in claim 1, wherein the amount of signal charge multiplication is controlled by controlling the level of one or more dc potentials applied to a register.

18. An arrangement as claimed in claim 1, wherein the charge capacity of at least some of the elements of the multiplication register is larger than that of elements of the output register.

19. An arrangement as claimed in claim 1 and including a plurality of multiplication registers arranged to receive signal charge from the output register, at least one of the plurality having associated therewith an additional register.

20. A CCD imager comprising the solid state imager arrangement as claimed in claim 1.

21. A solid state imager arrangement comprising: an image area, an output register which receives signal charge from the image area, a multiplication register comprising a plurality of multiplication elements into which signal charge from the output register is transferred for charge multiplication, an additional register comprising additional elements arranged to receive excess signal charge from the multiplication register, and a clocking arrangement, wherein the clocking arrangement is arranged to clock the excess signal charge from the multiplication elements to corresponding ones of the additional elements.

22. An arrangement as claimed in claim 21, wherein the clocking arrangement comprises clocked wells arranged so that excess signal charge is transferred from the multiplication elements to the corresponding ones of the additional elements without charge from the additional elements returning to the multiplication elements.

23. An arrangement as claimed in claim 22, wherein the clocked wells are clocked by a clock source, the clock source also being arranged to clock the multiplication and/or the additional registers.

24. A solid state imager arrangement comprising: an image area, an output register which receives signal charge from the image area, a separate multiplication register into which signal charge from the output register is transferred, means for obtaining signal charge multiplication by transferring the charge through a sufficiently high field in elements of the multiplication register, and an additional register into which excess signal charge is transferred, wherein the amount of excess charge transferred to the additional register is determined by implanted barrier means, the barrier means is located between the multiplication register and the additional register.

25. An arrangement as claimed in claim 24, wherein the excess signal charge is that exceeding a threshold level.

26. An arrangement as claimed in claim 25, wherein the threshold level is variable.

27. An arrangement as claimed in claim 24, wherein the excess signal charge is a percentage of the signal charge received from the image area.

28. An arrangement as claimed in claim 24, wherein the multiplication register and additional register have the same number of elements.

29. An arrangement as claimed in claim 24 including gate means for controlling the transfer of excess signal charge to the additional register.

30. An arrangement as claimed in claim 24 including means for combining signal charge after it has been transferred through the multiplication register with excess charge from the additional register.

31. An arrangement as claimed in claim 24, wherein signal charge multiplication is obtained in the additional register.

32. An arrangement as claimed in claim 24 including a plurality of additional registers associated with the multiplication register.

33. A solid state imager arrangement comprising: an image area, an output register which receives signal charge from the image area, a separate multiplication register into which signal charge from the output register is transferred, means for obtaining signal charge multiplication by transferring the charge through a sufficiently high field in elements of the multiplication register, and an additional register into which excess signal charge is transferred, wherein signal charge multiplication is obtained in the additional register.

34. An arrangement as claimed in claim 33, wherein the excess signal charge is that exceeding a threshold level.

35. An arrangement as claimed in claim 34, wherein the threshold level is variable.

36. An arrangement as claimed in claim 33, wherein the excess signal charge is a percentage of the signal charge received from the image area.

37. An arrangement as claimed in claim 33, wherein the multiplication register and additional register have the same number of elements.

38. An arrangement as claimed in claim 33 including gate means for controlling the transfer of excess signal charge to the additional register.

39. An arrangement as claimed in claim 33 including means for combining signal charge after it has been transferred through the multiplication register with excess charge from the additional register.

40. An arrangement as claimed in claim 33 including a plurality of additional registers associated with the multiplication register.

41. A solid state imager arrangement comprising: an image area, an output register which receives signal charge from the image area, a separate multiplication register into which signal charge from the output register is transferred, means for obtaining signal charge multiplication by transferring the charge through a sufficiently high field in elements of the multiplication register, and a plurality of additional registers associated with the multiplication register into which excess signal charge is transferred.

42. An arrangement as claimed in claim 41, wherein the excess signal charge is that exceeding a threshold level.

43. An arrangement as claimed in claim 42, wherein the threshold level is variable.

44. An arrangement as claimed in claim 41 wherein the excess signal charge is a percentage of the signal charge received from the image area.

45. An arrangement as claimed in claim 41, wherein the multiplication register and additional register have the same number of elements.

46. An arrangement as claimed in claim 41 including gate means for controlling the transfer of excess signal charge to the additional register.

47. An arrangement as claimed in claim 41 including means for combining signal charge after it has been transferred through the multiplication register with excess charge from the additional register.

48. A solid state imager arrangement comprising: an image area, an output register which receives signal charge from the image area, a separate multiplication register into which signal charge from the output register is transferred, means for obtaining signal charge multiplication by transferring the charge through a sufficiently high field in elements of the multiplication register, and an additional register into which excess signal charge is transferred wherein excess signal charge is transferred to the additional register via one or more elements of the multiplication register, wherein signal charge from the output register is applied to a separator which separates the excess signal charge from remaining signal charge, the excess charge being transferred to the additional register and the remaining signal charge to the multiplication register.

* * * * *